(12) United States Patent
Greco

(10) Patent No.: US 7,390,615 B2
(45) Date of Patent: Jun. 24, 2008

(54) INTEGRATED CIRCUIT FUSE AND METHOD OF OPENING

(75) Inventor: Stephen E. Greco, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 720 days.

(21) Appl. No.: 10/604,011

(22) Filed: Jun. 20, 2003

(65) Prior Publication Data

US 2004/0259035 A1  Dec. 23, 2004

(51) Int. Cl.
*H01L 23/52* (2006.01)
*H01L 23/48* (2006.01)

(52) U.S. Cl. ........................ 430/313; 430/311; 430/945; 257/529; 257/762

(58) Field of Classification Search ...................... None
See application file for complete search history.

(56) References Cited

U.S. PATENT DOCUMENTS 5,953,577 A * 9/1999 Huggins .................... 438/4
6,498,385 B1 12/2002 Daubenspeck et al.

* cited by examiner

*Primary Examiner*—Mark F. Huff
*Assistant Examiner*—Daborah Chacko Davis
(74) *Attorney, Agent, or Firm*—Lisa U. Jaklitsch; Hoffman, Warnick & D'Alessandro LLC

(57) ABSTRACT

An integrated circuit, a fuse therefor and fuse opening method are disclosed. The method implements fuse opening using a wet etchant. As a result, there is no explosion that causes damage to surrounding material. In addition, use of the wet etchant allows positioning of a fuse in any metal layer including any non-last metal layer, thus increasing design possibilities.

10 Claims, 9 Drawing Sheets

INTEGRATED CIRCUIT FUSE AND METHOD OF OPENING

BACKGROUND OF INVENTION

The present invention relates generally to integrated circuits, and more particularly, to an integrated circuit fuse and method of opening a fuse.

Back-end-of-line (BEOL) modifications are common in integrated circuit (IC) manufacture. One mechanism for making changes to an IC is to open a fuse that has been built into the IC. One widely used approach to opening a fuse is using a laser to destroy a fuse wire. Laser blown fuses have the advantage of allowing only selected fuses to be blown without the use of a chrome-on-glass mask. In operation, an infrared laser is used to heat a element to the point where it is destroyed, opening the wiring path.

One disadvantage of this approach, however, is that the destruction of the element is explosive and oftentimes causes damage to surrounding materials, e.g., insulator. Conventionally, damage to surrounding materials is inadequate to harm the delicate wiring at lower levels, which could cause IC failure. In many newer applications, however, very large elements, e.g., wide and tall, are provided at the last level to accommodate better power distribution. Unfortunately, larger elements result in larger fuses that require more laser energy to open, and thus cause more damage to surrounding materials. Accordingly, there is now a higher risk of damage to the delicate wiring used at the lower levels and a higher risk of IC failure.

Another disadvantage of current fuse technology is the necessity to place the fuses in the last metal layer, which limits design possibilities.

In view of the foregoing, there is a need for a method of opening an IC fuse that does not damage surrounding areas, and allows for non-last metal layer positioning of the fuse.

SUMMARY OF INVENTION

The invention includes an integrated circuit, a fuse therefore and a fuse opening method. The method implements fuse opening using a wet etchant. As a result, there is no explosion that causes damage to surrounding material. In addition, use of the wet etchant allows positioning of a fuse in any any non-last metal layer, thus increasing design possibilities.

A first aspect of the invention is directed to a method for opening an integrated circuit fuse, the method comprising the steps of: generating at least one opening to a fuse element that couples a plurality of terminals; and wet etching the fuse element to open the fuse.

A second aspect of the invention is directed to an integrated circuit fuse comprising: a plurality of terminals coupled by a fuse element; wherein the fuse element is located in a non-last metal layer.

A third aspect of the invention is directed to an integrated circuit comprising: a fuse including a plurality of terminals coupled by a fuse element; wherein the fuse element is located in a non-last metal layer.

A fourth aspect of the invention is directed to an integrated circuit fuse comprising: a plurality of terminals coupled by a fuse element; wherein each terminal is fully-landed on a wire of the fuse element.

A fifth aspect of the invention is directed to an integrated circuit comprising: an opened fuse area including a metal liner of a fuse element, the fuse element having been removed to generate the opened fuse area, the metal liner being intact immediately adjacent to, and in non-contact, with a plurality of terminals.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
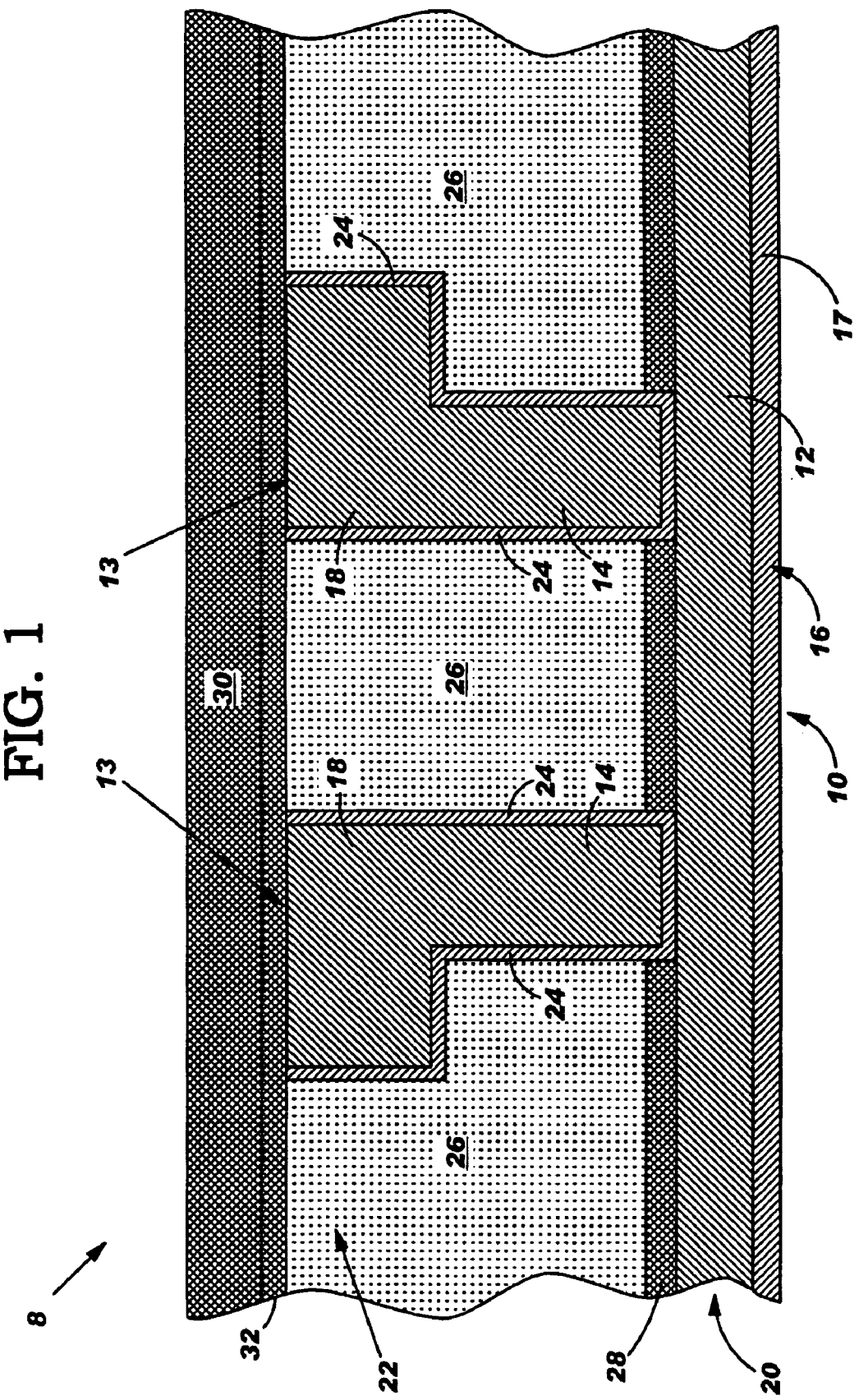
FIG. 1 shows one embodiment of an integrated circuit fuse according to the invention.

With reference to the accompanying drawings, FIG. 1 is cross-sectional view of an integrated circuit (IC) 8 including one embodiment of an IC fuse 10 according to the invention. IC fuse 10 includes a plurality of terminals 13 coupled by a fuse element 16. In the FIG. 1 embodiment, fuse element 16 is provided in the form of a horizontal wire 12 that couples terminals 13, which each include a stud 14 and a horizontal wire 18. In the FIG. 1 embodiment, terminals 13 are also located in the same layer. It is understood that each wire 18 continues on in a direction perpendicular to the page, i.e., into and/or out of the page. Each stud 14 is provided as a vertical wire and couples at least one respective wire 18 to fuse element 16. Each stud 14 and wire 18 includes a metal liner 24 of, for example, tantalum, tungsten, titanium nitride, or any other liner metal used for such purposes. Each stud 14 is fully-landed on a wire 12 of fuse element 16. That is, each metal liner 24 is on top of wire 12 of fuse element 16, and does not contact a metal liner 17 that surrounds at least a portion of fuse element 16.

Fuse element 16 is shown located in a penultimate metal layer 20, but may be located in any non-last metal layer. In addition, while wires 18 are shown in a last metal layer 22, they may be located in any metal layer. In one embodiment, element 16, wires 18 and studs 14 are all made of copper. However, other materials such as aluminum are also possible.

Terminals 13 are surrounded by an insulator 26, which is typically some type of glass, e.g., silicon oxide. A thin diffusion barrier or cap 28 of, for example, silicon nitride (SiN) or silicon carbide (SiC), is also typically provided on top of fuse element 16. A final insulating passivation layer 30 is also shown. Passivation layer 30 may include silicon dioxide, silicon nitride, silicon carbide or a combination thereof, and may consist of sublayers (not all shown) including, for example, a thin diffusion barrier 32 on top of wires 18. Passivation layer 30 may also include a polyimide or other polymeric layer(s). Diffusion barrier 32 may include, for example, SiN, SiC or other diffusion barrier material.

Figure 2:
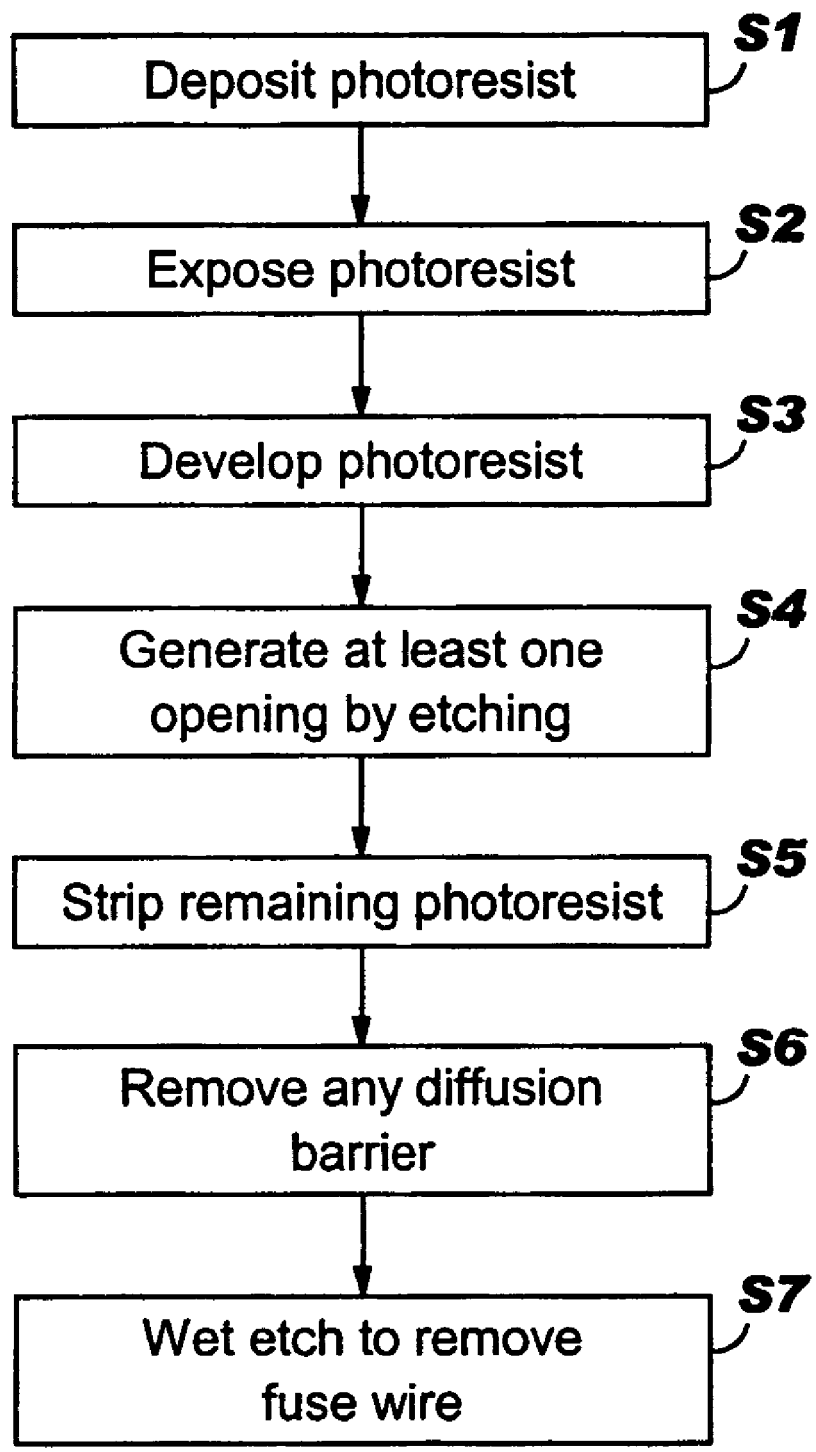
FIG. 2 shows a flow diagram of a method for opening the fuse of FIG. 1.
Figure 3:
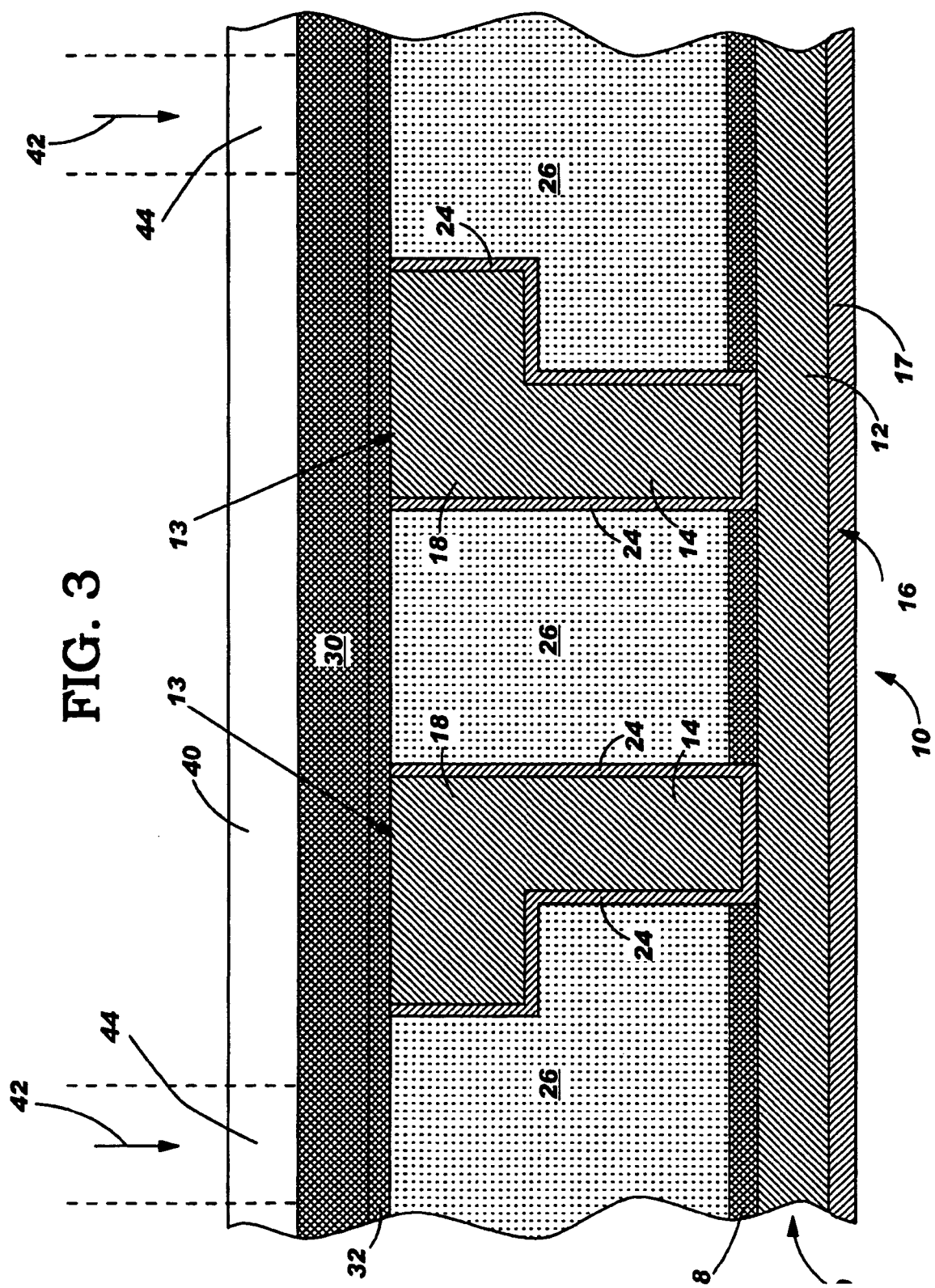
FIGS. 3-7 show steps of the method of FIG. 2.
Figure 4:
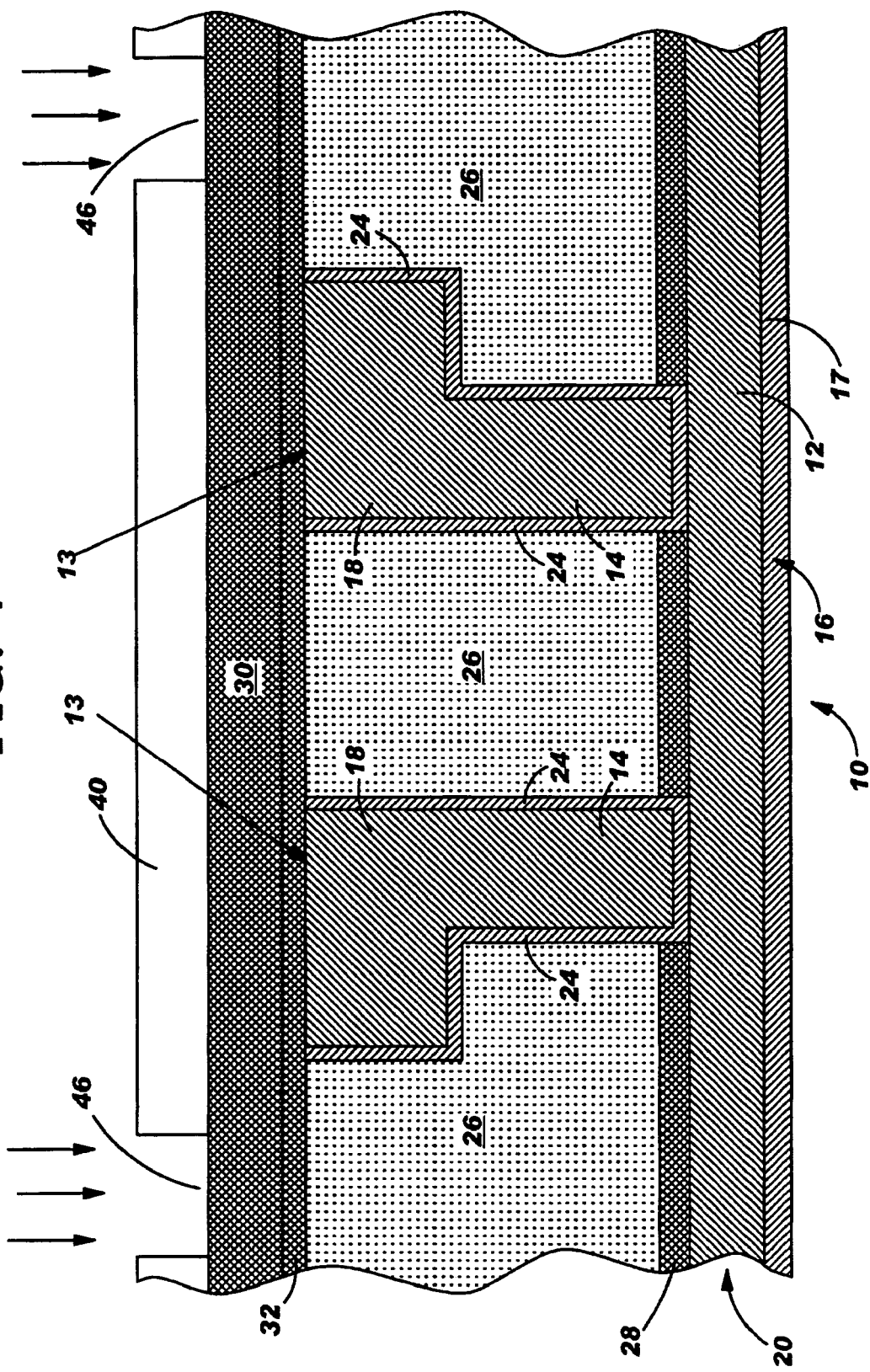

Referring to FIG. 2, a flow diagram of a method for opening IC fuse 10 is shown. FIGS. 3-7 illustrate the steps of the method. Steps S1-S4 (or steps S1-S6), as will be described below, collectively generate at least one opening 50 (FIG. 5) to fuse element 16. Referring to FIGS. 2 and 3, in step S1, a layer 40 is deposited on passivation layer 30. In one embodiment layer 40 is a photoresist. In this case in step S2, photoresist 40 is exposed using laser light 42 of the proper wavelength to generate at least one opening area 44. In one embodiment, ultraviolet laser light is used. In this manner, laser equipment similar to the more conventional infrared laser fuse opening equipment may continue to be used, and only certain fuses can be targeted for opening. In an alternative embodiment, layer 40 may be provided as a polymer that ablates upon exposure to laser light 42 to generate at least one opening area 44. Referring to FIGS. 2 and 4, in step S3, layer 40 is developed or opened to leave an opening 46 where each opening area 44 (not shown) was generated. Steps S1-S3, collectively, apply a layer 40 to define an opening area 44 (FIG. 4).

Figure 5:
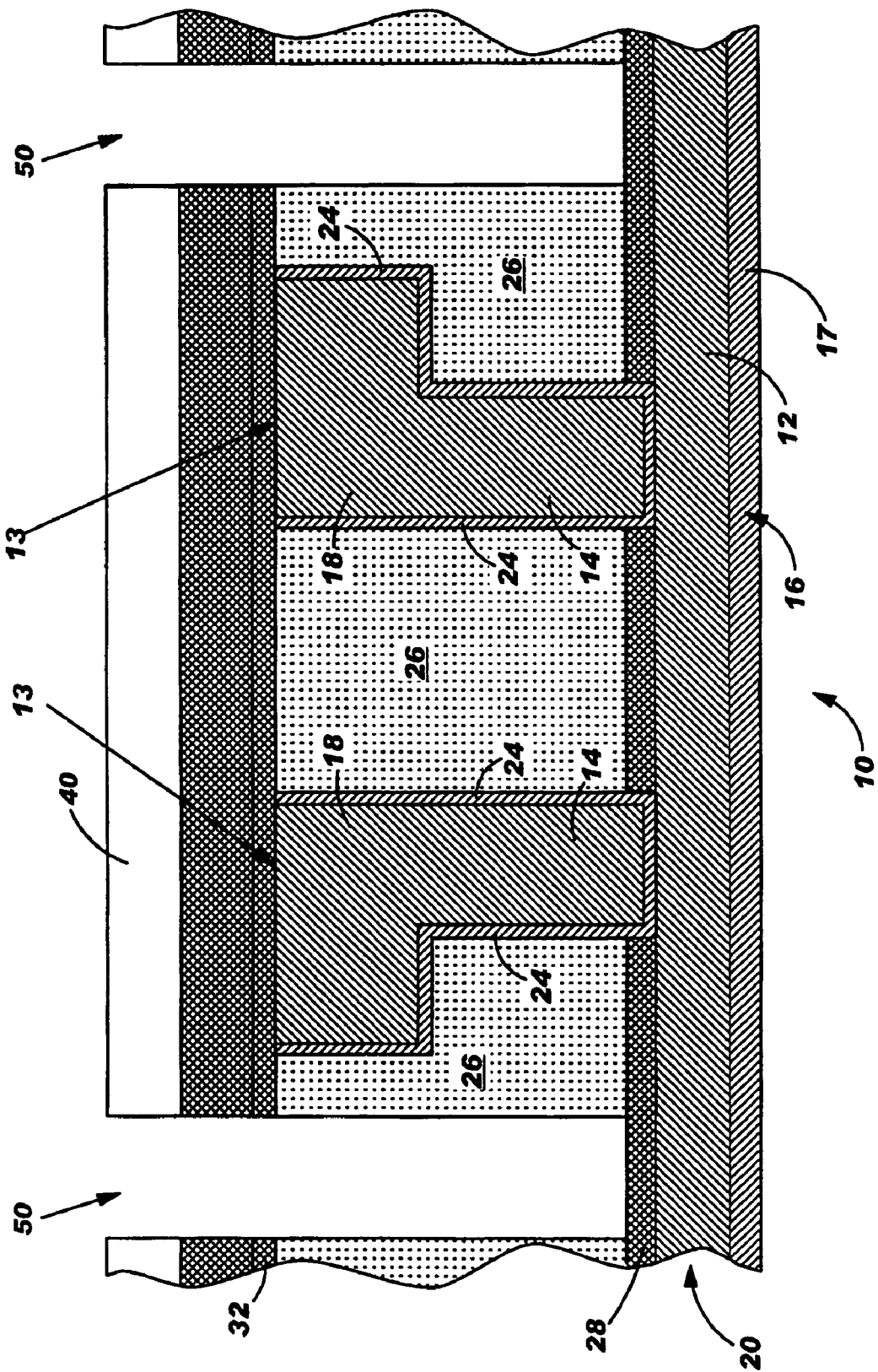

Referring to FIGS. 2 and 5, in step S4, at least one opening 50 is generated by etching, such as reactive ion etching (RIE), to remove passivation layer 30 and insulator 26 beneath each photoresist opening 46, i.e., in the areas where there is no photoresist 40. As noted earlier, passivation layer 30 and insulator 26 may include sublayers, each of which are removed by etching. In any case, etching chemistry can be altered as necessary during the course of operation to remove all and stop on diffusion barrier 28 on top of wire 12 of fuse element 16. If no diffusion barrier 28 is provided, each opening 50 fully extends to wire 12 of fuse element 16. However, if diffusion barrier 28 is provided, the process includes step S6, described below.

Referring to FIGS. 2 and 5, in step S5, the remaining photoresist 40 (or polymer if used) is stripped, for example, by an oxygen plasma or any other now known or later developed method.

Figure 6:
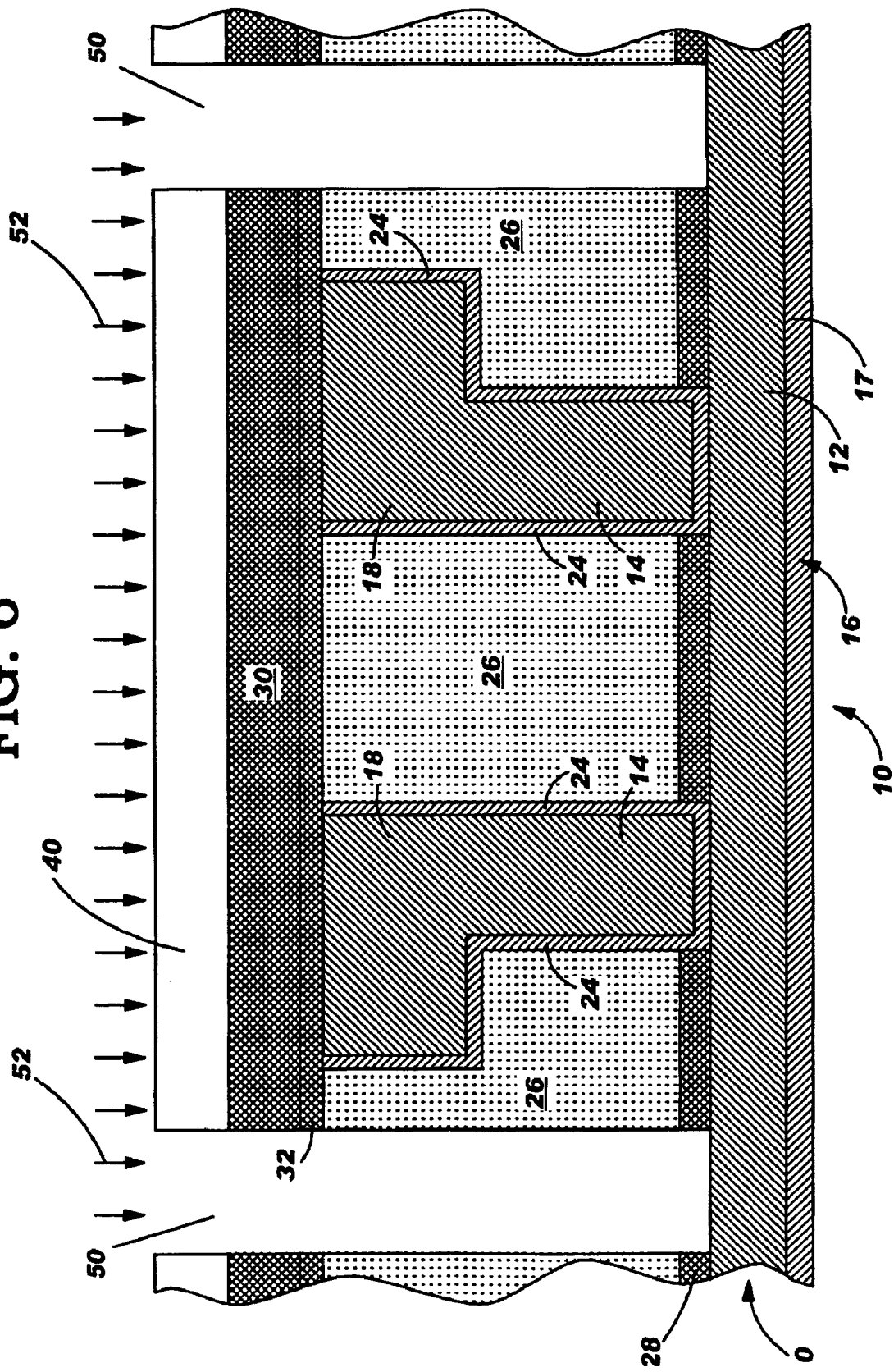

Referring to FIGS. 2 and 6, in step S6, if a diffusion barrier 28 is provided, it is removed such that each opening 50 fully extends to wire 12 of fuse element 16. Removal of any diffusion barrier 28 may be made, for example, by reactive ion etching. If wire 12 of fuse element 16 is provided as copper, etching may occur in a non-oxygen plasma to prevent corrosion to fuse wire 16. Steps S1-S5, or steps S1-S6, collectively, generate at least one opening 50 to fuse element 16.

Figure 7:
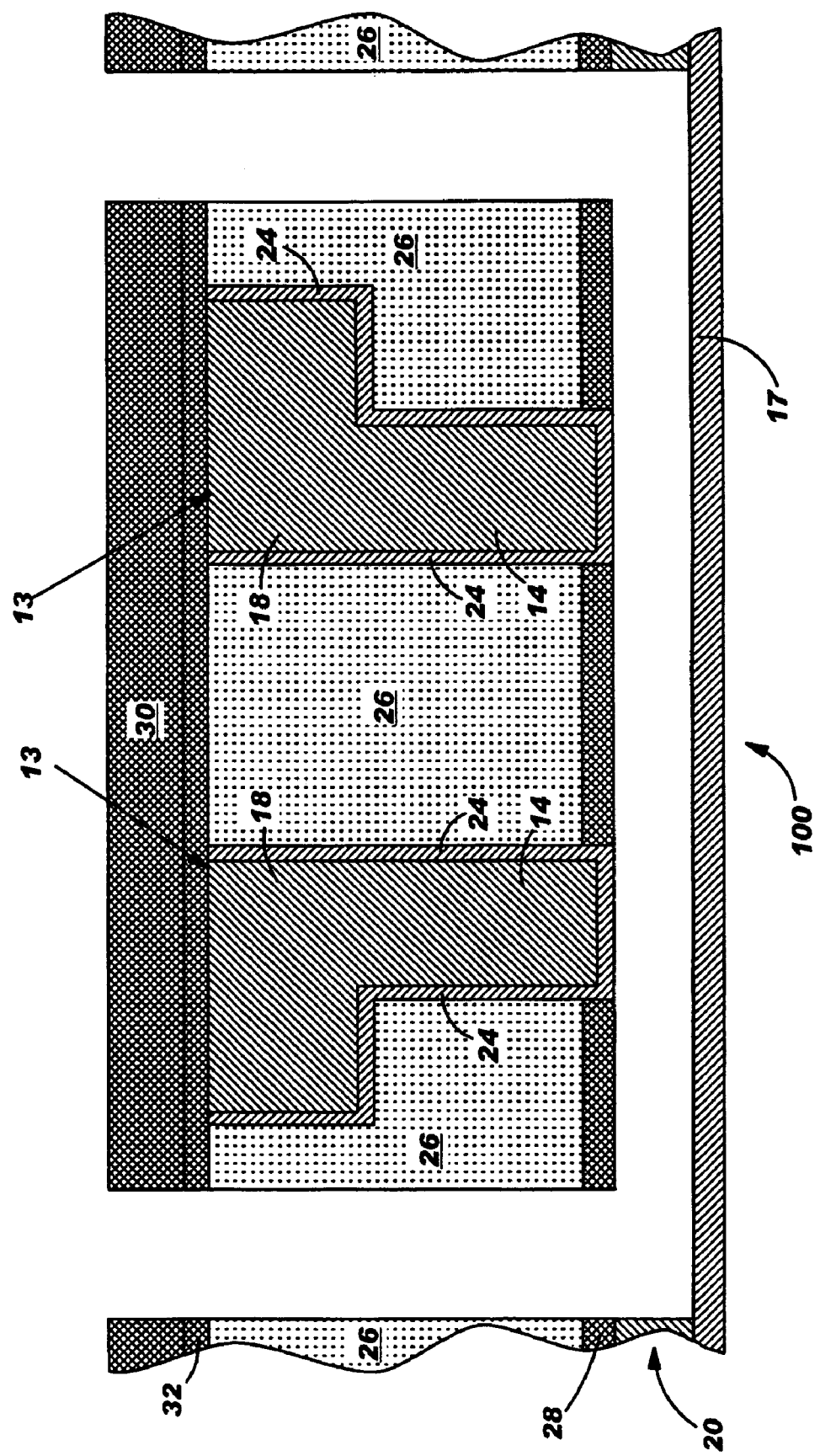
Figure 8:
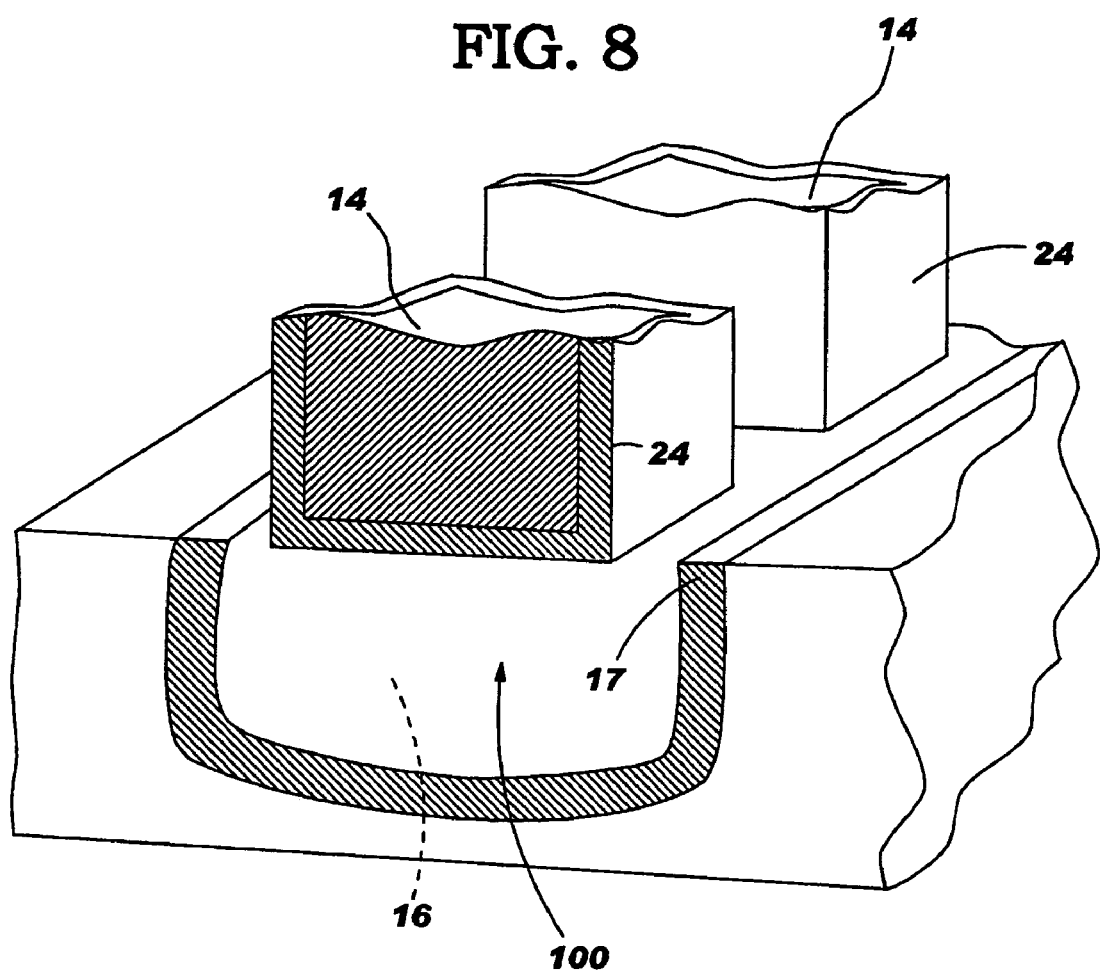
FIG. 8 shows a perspective cross-sectional view of an opened fuse area generated according to the method of FIGS. 3-7.

Referring to FIGS. 2 and 6, in step S7, wet etching 52 is used to remove, i.e., dissolve, wire 12 of fuse element 16. Wet etchant 52 may be any of various aggressive wet etches suitable for wire 12 material. Wet etchant 52 cuts under terminals 14 and dissolves wire 12 of fuse element 16 therebetween. Since terminals 13 are fully-landed on wire 12 of fuse element 16, once the fuse wire is removed, the circuit is open. The resulting open fuse is shown in FIGS. 7 and 8. In the case where wire 12 of fuse element 16 is copper, wet etchant 52 may include at least one of sulfuric acid, aqueous ammonium persulfate, hydrogen peroxide and water. Wet etchant 52 can act sideways so that fuse element 16 can be completely dissolved. Terminals 13 will not be affected by wet etchant 52 because they are surrounded on the sides (studs 14 and wires 18) and bottom (wires 18) by metal liner 24, which is not affected by wet etchant 52. Note, however, metal liner 17 material, as shown in FIG. 8, is not on top of fuse element 16 and, therefore, does not prevent wet etching of fuse element 16. As shown, one opening 50 is generated to each side of terminals 13. It should be recognized, however, that any number of openings 50, including one, may be generated depending on the required space for wet etchant 52, e.g., how much wet etchant 52 is required, where it is required, venting required, etc. It should also be recognized that the shape of each opening 50 may be adjusted to address different situations, e.g., opening 50 may be semi-circular, elongated, etc.

Referring to FIG. 8, IC 8 including an opened fuse area 100 generated according to the above method is shown. Opened fuse area 100 includes a metal liner 17 of a fuse element 16 (not actually shown) that has been removed to generate the opened fuse area. Metal liner 17 is intact immediately adjacent to, and in non-contact, with plurality of terminals 13. FIG. 8 illustrates how terminals 13 were fully-landed on fuse element 16, now removed, such that once fuse element 16 is removed, terminals 13 no longer make contact with fuse element 16 or a metal liner 17 thereof. Since the above method is non-damaging to everything except wire 12 of fuse element 16, metal liner 17 remains intact immediately adjacent terminals 13, as opposed to having been explosively removed.

It should be recognized that the particular IC fuse 10 shown is only illustrative and that the invention may include any IC fuse 10 having a fuse element 16 in any non-last metal layer. It should also be recognized that IC fuse 10 is only one of many possible layouts for wiring, and that fuse element 16 may be provided in different designs (shapes) and appropriate openings made to allow wet etchant 52 access to any location of the fuse wire. For example, one alternative embodiment is shown in FIG. 9.

Figure 9:
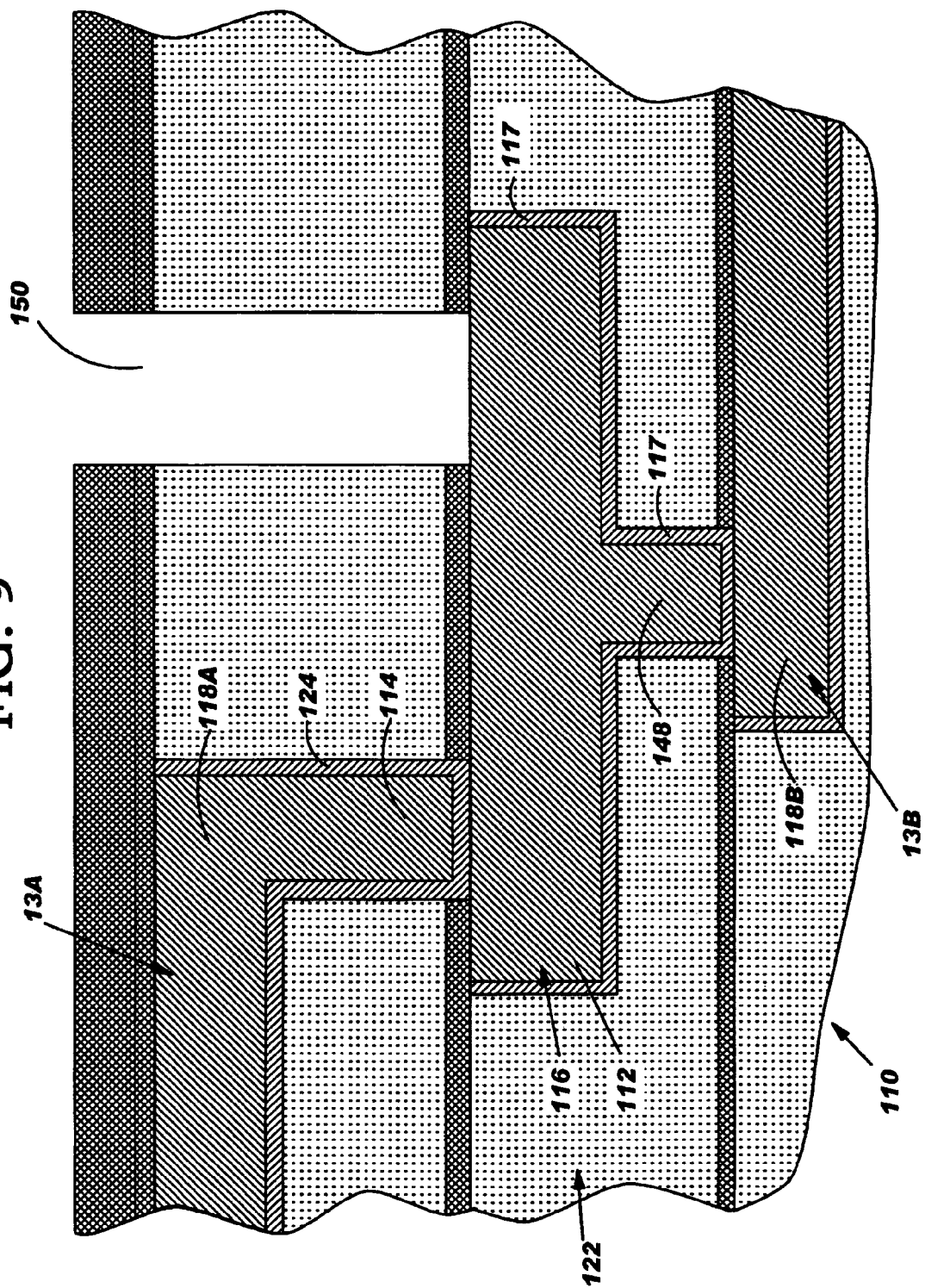
FIG. 9 shows an alternative embodiment of an integrated circuit fuse according to the invention.

In the FIG. 9 embodiment, a vertical fuse 110 including a fuse element 116 including a horizontal fuse wire 112 and a fuse vertical stud 148 may be provided in a vertical fashion between two substantially horizontal terminals 13A, 13B. In this case, a higher terminal 13A includes a horizontal wire 118A and a terminal vertical stud 114, and a lower terminal 113B includes a horizontal wire 118B. In this case, only one terminal 13A requires a terminal vertical stud 114 for horizontal wire 118A since fuse element 116 includes its own fuse vertical stud 148 extending to horizontal wire 118B. A single opening 150 is provided such that a wet etchant (not shown) may remove fuse element 116 including wire 112 and vertical stud 148. Vertical stud 114 of terminal 13A must be fully landed on wire 112 of fuse element 116, as described above, to prevent shorting from a liner 124 of terminal 13A to a liner 117 of fuse element 116 when vertical fuse 110 is opened. Fuse vertical stud 148 may be directly below terminal vertical stud 114 or offset as shown. Fuse vertical stud 148, however, does not necessarily need to be fully landed on horizontal wire 118B. The above-described structure may be provided in any layers desired so long as opening 150 can reach fuse element 116. In view of the foregoing, the invention should not be limited to any particular design.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

The invention claimed is:

1. A method for opening an integrated circuit fuse, the method comprising the steps of:
   generating at least one opening to a fuse element that couples a plurality of terminals and is located in a non-last metal layer; and
   wet etching die fuse element to open the fuse.

2. The method of claim 1, wherein the generating step includes:
   applying a photoresist to define an opening area for each opening; and
   etching to generate the at least one opening.

3. The method of claim 2, wherein the applying step includes:

depositing the photoresist;

exposing the photoresist using laser light; and developing the photoresist to define the opening area for each opening.

4. The method of claim 3, wherein the generating step further includes removing the photoresist and a diffusion baffler on the fuse element.

5. The method of claim 1, wherein the generating step includes applying a polymer and ablating the polymer with a laser to define the at least one opening.

6. The method of claim. 1, wherein the at least one opening includes one opening to each side of the plurality of terminals.

7. The method of claim 6, wherein the wet etching step removes the fuse element under the plurality of terminals.

8. The method of claim 1, wherein each terminal is fully-landed on a wire of the fine element and includes a metal liner surrounding the terminal.

9. The method of claim 1, wherein the fuse element and each terminal include copper.

10. The method of claim 1, wherein the wet etchant includes at least one of sulfuric acid, aqueous ammonium persulfate, hydrogen peroxide and water.

* * * * *